US012603116B2

(12) United States Patent
Shin et al.

(10) Patent No.: US 12,603,116 B2
(45) Date of Patent: Apr. 14, 2026

(54) OPERATING METHOD OF MEMORY CONTROLLER, AND MEMORY DEVICE

(71) Applicants:SAMSUNG ELECTRONICS CO., LTD., Suwon-si (KR); Seoul National University R&DB Foundation, Seoul (KR)

(72) Inventors: Hoon Shin, Suwon-si (KR); Jaewook Lee, Seoul (KR); Donghwee Kim, Suwon-si (KR); Rihae Park, Seoul (KR)

(73) Assignees: SAMSUNG ELECTRONICS CO., LTD., Suwon-si (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 164 days.

(21) Appl. No.: 18/473,492

(22) Filed: Sep. 25, 2023

(65) Prior Publication Data

US 2024/0135977 A1    Apr. 25, 2024
US 2024/0233788 A9    Jul. 11, 2024

(30) Foreign Application Priority Data

Oct. 25, 2022    (KR) ........................ 10-2022-0138577

(51) Int. Cl.
*G11C 7/12*      (2006.01)
*G11C 7/08*      (2006.01)
(Continued)

(52) U.S. Cl.
CPC .................. *G11C 7/12* (2013.01); *G11C 7/08* (2013.01); *G11C 7/1069* (2013.01); *G11C 7/14* (2013.01)

(58) Field of Classification Search
CPC ........... G11C 7/12; G11C 7/08; G11C 7/1069; G11C 7/14; G11C 11/401; G11C 7/1006;
(Continued)

(56) References Cited

U.S. PATENT DOCUMENTS 9,007,866 B2    4/2015    Fisch et al.
9,299,398 B2    3/2016    Fisch et al.
(Continued)

OTHER PUBLICATIONS

Extended European Search Report dated Mar. 20, 2024 in corresponding European Patent Application No. 23205790.1, 8 pages.
(Continued)

*Primary Examiner* — Huan Hoang
(74) *Attorney, Agent, or Firm* — F. CHAU & ASSOCIATES, LLC

(57) ABSTRACT

A memory device and an operating method of a memory controller are described in which the operating method includes determining that a NOT operation for data of a cell is to be performed by the memory device; forming, in a bit line connected to the cell, a reference voltage between a first voltage corresponding to the data and a second voltage corresponding to inversion data of the data; forming, in the bit line, a third voltage between the second voltage and the reference voltage by connecting the bit line and a bit line bar; forming the reference voltage in the bit line bar; and sensing the inversion data based on the third voltage formed in the bit line and the reference voltage formed in the bit line bar, wherein the inversion data comprises an output of the NOT operation for the data of the cell.

18 Claims, 9 Drawing Sheets

(51) Int. Cl.
    *G11C 7/10*       (2006.01)
    *G11C 7/14*       (2006.01)

(58) Field of Classification Search
    CPC ......... G11C 16/08; G11C 16/12; G11C 16/24;
                         G11C 7/06; G06F 3/0658
    USPC ................................................... 365/185.25
    See application file for complete search history.

(56)                 References Cited

U.S. PATENT DOCUMENTS

| | | |
|---|---|---|
| 2004/0037107 A1 | 2/2004 | Matsuoka |
| 2004/0141362 A1 | 7/2004 | Sumitani et al. |
| 2010/0165706 A1 | 7/2010 | Itoh et al. |
| 2010/0259999 A1* | 10/2010 | Lee ........................ H10B 10/12 |
| | | 365/189.11 |
| 2014/0016402 A1* | 1/2014 | Burnett ................. G11C 11/412 |
| | | 365/156 |
| 2014/0313834 A1 | 10/2014 | Fisch et al. |
| 2015/0213847 A1 | 7/2015 | Fisch et al. |

OTHER PUBLICATIONS

Choi, et al., "A Novel In-DRAM Accelerator Architecture for Binary Neural Network," 2020 IEEE Symposium in Low-Power and High-Speed Chips (COOL CHIPS), 3 pages.

Office Action dated Aug. 28, 2024 in related KR Patent Application No. 10-2022-0138577, in Korean, 5 pages.

Office Action dated Aug. 28, 2024 in related KR Patent Application No. 10-2022-0138577, English Translation, 2 pages.

Lee, et al., "A 1ynm 1.25V 8Gb, 16Gb/s/pin GDDR6-based Accelerator-in-Memory supporting 1TFLOPS MAC Operation and Various Activation Functions for Deep-Learning Applications", ISSCC 2022, IEEE International Solid-State Circuits Conference, Session 11, Compute-in-Memory and SRAM, DOI: 10.1109/ISSCC42614.2022.9731711, 3 pages.

Lee, et al., "Hardware Architecture and Software Stack for PIM Based on Commercial DRAM Technology", in 48th Annu. ACM/IEEE Int. Symp. on Computer Architecture (ISCA), 2021, DOI: 10.1109/ISCA52012.2021.00013, pp. 43-56.

Kwon, et al., "A 20nm 6GB Function-In-Memory DRAM, Based on HBM2 with a 1.2TFLOPS Programmable Computing Unit Using Bank-Level Parallelism, for Machine Learning Applications", in IEEE International Solid-State Circuits Conference, ISSCC Session 25, 2021, 3 pages.

Hajinazar, et al., "SIMDRAM: A Framework for Bit-Serial SIMD Processing Using DRAM Extended Abstract", in Proc. 26th ACM Int. Conf. Architectural Support Program. Lang. Operating Syst. (ASPLOS), New York, NY, USA: Association for Computing Machinery, 2021, doi: 10.1145/3445814.3446749, pp. 1-3.

Xin, et al., "ELP2IM: Efficient and Low Power Bitwise Operation Processing in DRAM", in Proc. IEEE Int. Symp. High Perform. Comput. Archit. (HPCA), Feb. 2020, DOI: 10.1109/HPCA47549.2020.00033, pp. 303-314.

Li, et al., "DRISA: A DRAM-based Reconfigurable In-Situ Accelerator", in Proc.50th Annu. IEEE/ACM Int. Symp. Microarchitecture, Oct. 2017, found on the internet at https://doi.org/10.1145/3123939.3123977, pp. 288-301.

Seshadri, et al., "RowClone: Fast and Energy-Efficient In-DRAM Bulk Data Copy and Initialization", in. Proc. 46th Annu. IEEE/ACM Int. Symp. Microarchitecture (MICRO), 2013, 13 pages.

Ali, et al., "In-Memory Lost-Cost Bit-Serial Addition using Commodity DRAM Technology", IEEE Trans. Circuits Syst. I, Reg. Papers, vol. 67, No. 1, Jan. 2020, DOI: 10.1109/TCSI.2019.2945617, 11 pages.

Roy, et al., "PIM-DRAM: Accelerating Machine Learning Workloads using Processing in Commodity DRAM", in IEEE Journal on Emerging and Selected Topics in Circuits and Systems, vol. 11, No. 4, Dec. 2021, (arXiv preprint arXiv:105.03736v3 [cs.LG] Aug. 16, 2021), doi: 10.1109/JETCAS.2021.3127517, 11 pages.

Deng, et al., "DrAcc: a DRAM based Accelerator for Accurate CNN Inference", in Proc. 55th ACM/ESDA/IEEE Design Autom. Conf. (DAC), Jun. 2018, found on the internet at https://doi.org/10.1145/3195970.3196029, 6 pages.

He, et al., "Newton: A DRAM-maker's Accelerator-in-Memory (AiM) Architecture for Machine Learning", in. Proc. 53rd Annu. IEEE/ACM Int. Symp. Microarchitecture (MICRO), Oct. 2020, DOI: 10.1109/MICRO50266.2020.00040, pp. 372-385.

Seshadri, et al. "Ambit: In-Memory Accelerator for Bulk Bitwise Operations Using Commodity DRAM Technology", in Proc. 50th Annu. IEEE/ACM Int. Symp. Microarchitecture, Oct. 2017, DOI: http://dx.doi.org/10.1145/3123939.3124544, pp. 273-287.

* cited by examiner

FIG. 1A                                        FIG. 1B

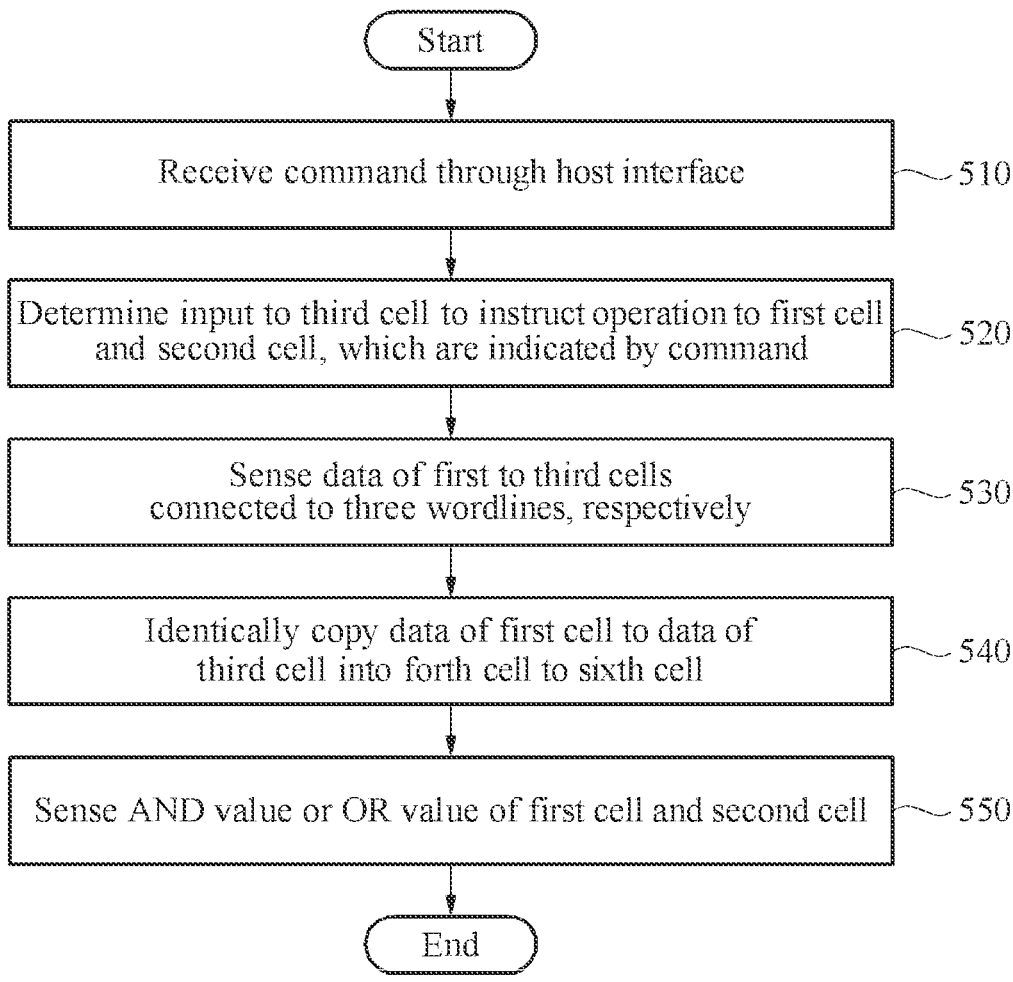

Start

Receive command through host interface                               ~510

Determine input to third cell to instruct operation to first cell
and second cell, which are indicated by command                       ~520

Sense data of first to third cells
connected to three wordlines, respectively                            ~530

Identically copy data of first cell to data of
third cell into forth cell to sixth cell                              ~540

Sense AND value or OR value of first cell and second cell             ~550

End

OPERATING METHOD OF MEMORY CONTROLLER, AND MEMORY DEVICE

CROSS-REFERENCE TO RELATED APPLICATION

This application claims priority under 35 U.S.C. 119 to Korean Patent Application No. 10-2022-0138577, filed on Oct. 25, 2022, in the Korean Intellectual Property Office, the disclosure of which is incorporated by reference herein for all purposes.

BACKGROUND

The disclosure relates to a memory device and an operating method of the memory device.

Many computing devices include one or more memory devices for storing data and one or more processing units capable of processing the data stored in the memory devices. Some computing operations involve bulk bit-wise operations on the data stored in the memory devices. The performance of bulk bitwise operations can be limited by the memory bandwidth available to the processing unit. Therefore, there is a need in the art for more efficient systems and methods for performing bitwise operations on data stored in a memory device.

SUMMARY

This Summary introduces a selection of concepts in a simplified form that are further described below in the Detailed Description. It is not intended to identify key features or essential features of the claimed subject matter, nor is it intended to be used as an aid in determining the scope of the claimed subject matter.

According to one or more embodiments of the disclosure, an operating method of a memory controller includes determining that a NOT operation for data of a cell is to be performed by the memory device; forming, in a bit line connected to the cell, a reference voltage between a first voltage corresponding to the data and a second voltage corresponding to inversion data of the data; forming, in the bit line, a third voltage between the second voltage and the reference voltage by connecting the bit line and a bit line bar; forming the reference voltage in the bit line bar; and sensing the inversion data based on the third voltage formed in the bit line and the reference voltage formed in the bit line bar, wherein the inversion data comprises an output of the NOT operation for the data of the cell.

According to one or more embodiments of the disclosure, an operating method of a memory controller includes determining that a logical operation is to be performed on a first cell and a second cell by the memory device, wherein the logical operation comprises an AND operation or an OR operation; copying the data of the first cell, the second cell, and a third cell into a fourth cell, a fifth cell, and a sixth cell, respectively; and sensing an output value of the logical operation based on a voltage formed in a bit line connected to the first cell and to the sixth cell.

According to one or more embodiments of the disclosure, a memory device includes a plurality of wordlines; a bit line connected to at least one activated wordline among a plurality of wordlines; a bit line bar configured to transfer inversion data of the bit line; a sense amplifier configured to sense data of the bit line and data of the bit line bar; and a pre-charge unit configured to pre-charge the bit line and the bit line bar, wherein the memory device is configured to perform a NOT operation based on the inversion data.

According to one or more embodiments of the disclosure, a method includes storing data in a first cell connected to a sense amplifier via a bit line of the first cell; storing inversion data in a second cell connected to the sense amplifier via a bit line bar of the first cell; determining that a NOT operation is to be performed on the data of the first cell; forming a voltage in the bit line based on the inversion data; and performing the NOT operation by sensing the voltage in the bit line using the sense amplifier.

Additional aspects of embodiments will be set forth in part in the description which follows and, in part, will be apparent from the description, or may be learned by practice of the disclosure.

BRIEF DESCRIPTION OF THE DRAWINGS

Aspects of the disclosure will become apparent and more readily appreciated from the following description along with the accompanying drawings, of which:

FIG. 5 is a flowchart illustrating an operating method of a memory controller for an AND operation or an OR operation, according to one or more embodiments of the disclosure.

DETAILED DESCRIPTION

The disclosure relates to a memory device and an operating method of a memory controller of the memory device. Some embodiments of the disclosure include systems and methods for computing bulk bitwise operations including AND, OR, and NOT operations within a memory device.

Many computing devices include one or more memory devices for storing data and one or more processing units capable of processing the data stored in the memory devices. Some computing operations involve bulk bit-wise operations on the data stored in the memory devices. However, the performance of bulk bitwise operations can be limited by the memory bandwidth available to the processing unit.

Embodiments of the disclosure include a memory device capable of performing bitwise operations directly, thereby reducing the bandwidth used to transmit data stored in the memory to a processor to perform the computations. For example, embodiments of the invention may include an Accelerator-in-Memory for bulk Bitwise operations (Ambit) that implements functions such as AND, OR, and NOT.

Embodiments of the disclosure may be implemented in a dynamic random access memory (DRAM), including processing in memory (PIM) DRAM or processor using memory DRAM. Accordingly, the cells described herein may include DRAM cells. However, the disclosure is not limited thereto and other memory cells may also be utilized.

Figure 1:
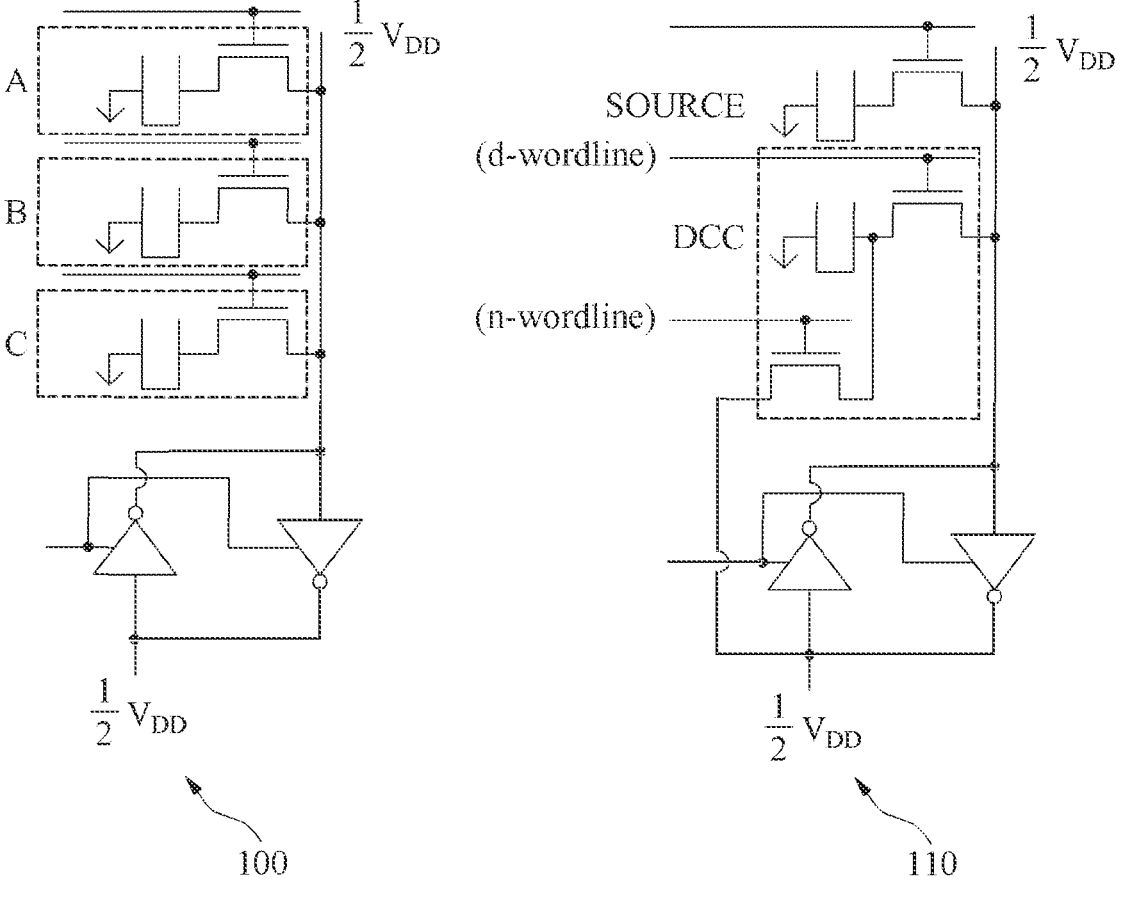
FIGS. 1A and 1B illustrate circuit configurations that implement AND, OR, and NOT functions according to one or more embodiments of the disclosure.

FIGS. 1A and 1B illustrate circuit configurations that implement AND, OR, and NOT operations.

In some embodiments, the configuration of FIG. 1A can be used to perform AND and OR operations, while the configuration of FIG. 1B can be used to perform NOT functions. However, according to embodiments of the disclosure, NOT operations may be performed using hardware other than that depicted in FIG. 1B. For example, NOT operations can be performed using memory cells that include a single transistor (as opposed to depending on a dual cell structure). Furthermore, other bitwise operations may be performed by combining AND, OR, and NOT operations.

In conventional memory devices, these three logic functions are not implemented in one circuit. For example, the AND and OR functions can be implemented in a circuit that is separated from another circuit implementing the NOT function.

FIG. 1A depicts a first circuit 100 configured to implement triple-row activation (TRA). Three cells A, B, and C on three different wordlines may be activated and the corresponding cell data may be sensed in a bit line common to the three cells. Each of the cells may store a value, e.g., a binary value of either 1 or 0. Different operations on A and B may be performed based on a value of C. For example, in the case of C=1, the function of A OR B may be implemented and in the case of C=0, the function of A AND B may be implemented.

FIG. 1B illustrates a second circuit 110, which may be implemented using a dual-contact cell (DCC) structure that includes two transistors and one capacitor (i.e., a 2T1C structure). A data wordline (d-wordline) connects to one of the transistors and a negation wordline (n-wordline) connects to another of the transistors. A NOT operation may be implemented by storing data of a bit line bar using the 2T1C structure. The n-wordline may be opened to bring NOT data of cell data to the bit line so that the NOT data of cell data may be sensed through a sense amplifier.

Figure 2:
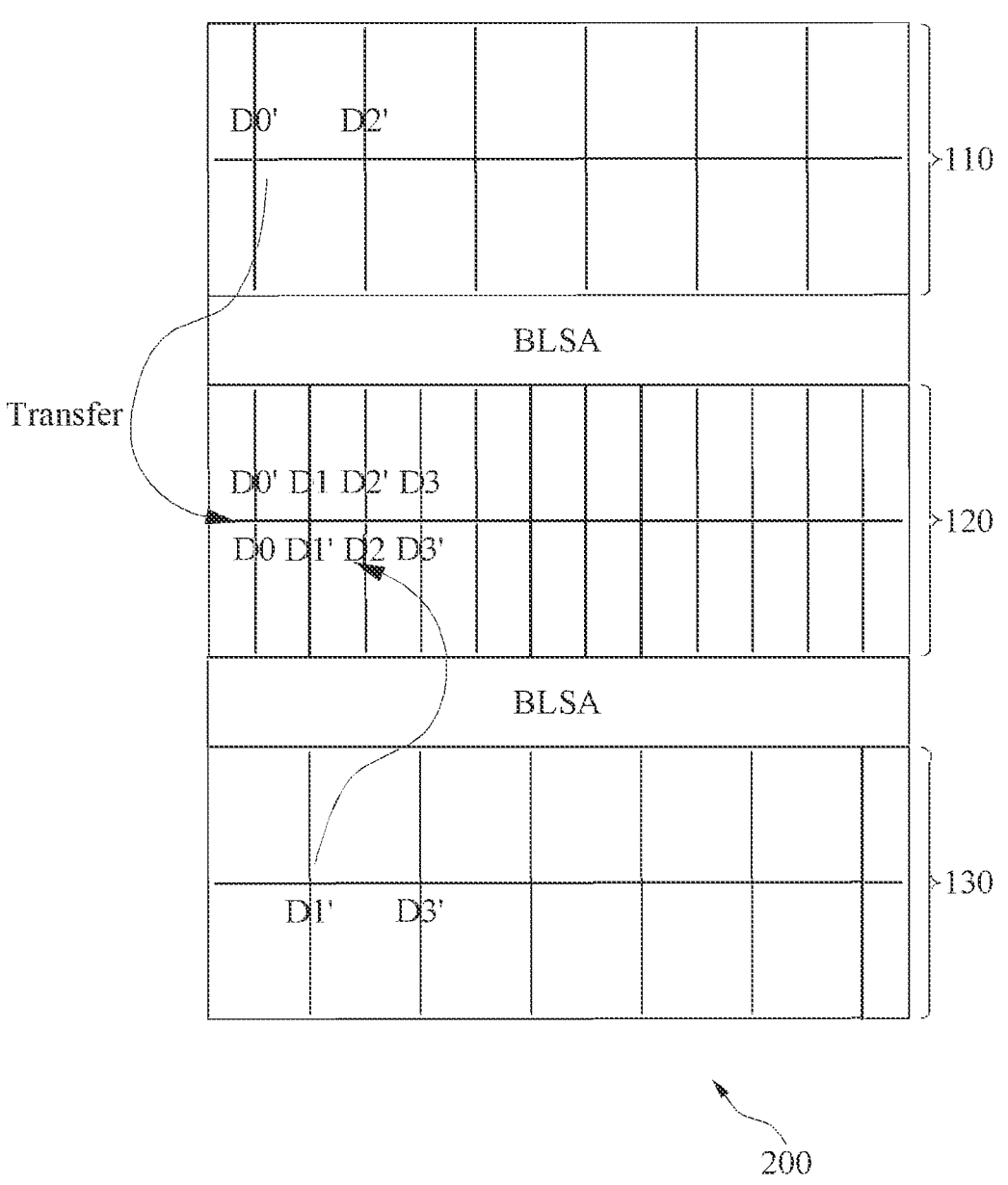
FIG. 2 is a circuit diagram illustrating a NOT operation in a memory device according to one or more embodiments of the disclosure.

FIG. 2 is a circuit diagram illustrating a NOT operation in a memory device 200, according to one or more embodiments of the disclosure. In some embodiments, a conventional DRAM memory cell may be used to perform the NOT operation. In other embodiments, a customized cell structure may be used.

In some examples, the memory device 200 has an open bit line structure with multiple cell arrays or subarrays. For example, a memory device may include an upper array 110, a center array 120, and a lower array 130. Data D0-D3 may be stored in the center array 120. In the example illustrated in 2, half of the bit lines in the center array 120 extend into the upper array 110, and half of the bit lines of center array 120 may extend into the lower array 130.

In some examples, inversion data (i.e., NOT data) D0' and D2' corresponding to data D0 and D2 is formed in the upper array 110 and inversion data D1' and D3' corresponding to data D1 and D3 is formed in the lower array 130. In some embodiments, a NOT operation may be implemented by bringing, to a cell in the center array 120, inversion data formed in the upper array 110 or the lower array 130.

In some embodiments, after activating the wordline of the center array 120 and then a bit line extending from the center array 120 to the upper array 110 (for D0' and D2') or the lower array 130 (for D1' and D3'), a wordline of the upper array 110 or the lower array 130 may also be activated. In this case, each wordline may initially have data of value 1 according to a row copy.

Thereafter, the inversion data D0' through D3' may be transmitted again to the center array 120, from the lower array 110 and the upper array 130. For example, the inversion data D0' and D2' sensed by the wordline of the upper array 110 may be transferred to the wordline of the center array 120, and the inversion data D1' and D3' sensed by the wordline of the lower array 130 may be transferred to the wordline of the center array 120. In some cases, only an upper array 110 or the lower array 130 is used for sensing and transferring inversion data.

Figure 3:
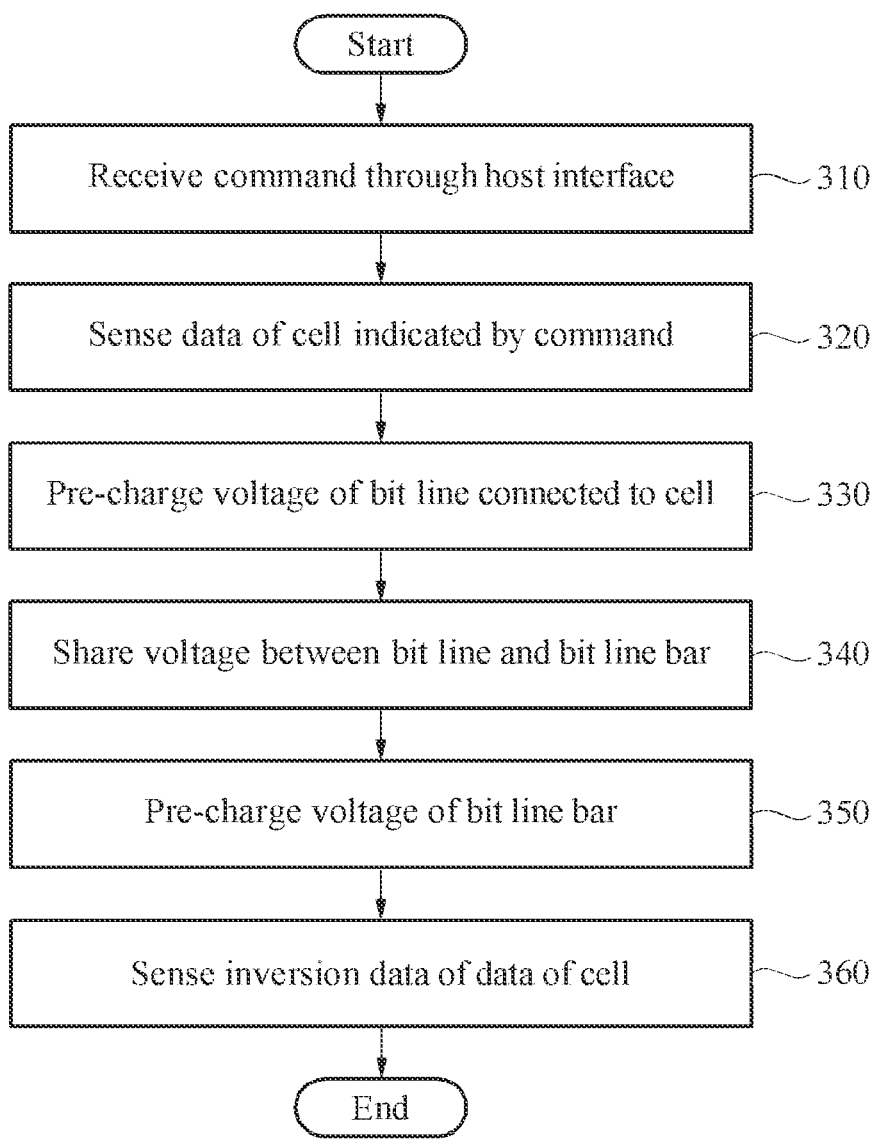
FIG. 3 is a flowchart illustrating an operating method of a memory controller for a NOT operation according to one or more embodiments of the disclosure.

FIG. 3 is a flowchart illustrating an operating method of a memory controller according to one or more embodiments of the disclosure.

The method depicted by FIG. 3 is an implementation of a NOT operation in a memory device. In some examples, inversion data of data input to a cell may be generated in a subarray and, based thereon, the inversion data generated in the subarray may be transferred to a cell to sense the inversion data of data of the cell.

In operation 310, the memory controller receives a command (e.g., from a host device via a host interface). The memory controller may determine operations to be performed based on the received command in order to control a memory device according to the command.

In some embodiments, the memory controller may determine that an AND, OR, or NOT operation is to be performed by the memory device based on the command.

In operation 320, when the memory controller determines that the NOT operation is to be performed, the memory controller senses the data of a cell indicated by the command. In some cases, the cell not be a dual contact cell.

In some embodiments, sensing the data of the cell may form a first voltage corresponding to the data of the cell in a bit line connected to the cell and a second voltage corresponding to the inversion voltage of the first voltage in a bit line bar forming the inversion voltage of the bit line. Accordingly, the data of the cell may be transferred to the bit line and the inversion data of the data of the cell may be transferred to the bit line bar.

In operation 330, the memory controller pre-charges the voltage of the bit line connected to the cell. The pre-charging of the bit line may form a reference voltage between the first voltage and the second voltage. For example, the voltage corresponding to the data of the cell may be pre-charged, so that the data of the cell may be erased.

In operation 340, the memory controller shares a voltage between the bit line and the bit line bar. Sharing the voltage between the bit line and the bit line bar may form, in the bit line, a third voltage between the second voltage and the reference voltage. For example, the third voltage may be an average value of the voltage of the bit line and the voltage of the bit line bar, or an average value of the second voltage (i.e., of the inversion data) and the reference voltage.

In operation 350, the memory controller pre-charges the voltage of the bit line bar. In some embodiments, the third voltage, which is shared between the bit line and the bit line bar by the pre-charging of the bit line bar, may be pre-charged in the bit line bar, so that the reference voltage may be formed in the bit line bar.

In operation 360, the memory controller senses the inversion value of the data of the cell based on the third voltage formed in the bit line and the reference voltage formed in the bit line bar.

In some embodiments, the pre-charging of the voltage of the bit line bar may generate a voltage difference between the bit line and the bit line bar, which may result in the inversion of the data initially sensed in each of the bit line and the bit line bar.

An example embodiment of an implementation of operations 320 to 360 is described in detail with reference to FIGS. 4A to 4E.

FIGS. 4A to 4E are diagrams illustrating a method of controlling a circuit for a NOT operation, according to one or more embodiments of the disclosure.

Figures 4A, 4B, 4C, 4D, 4E:
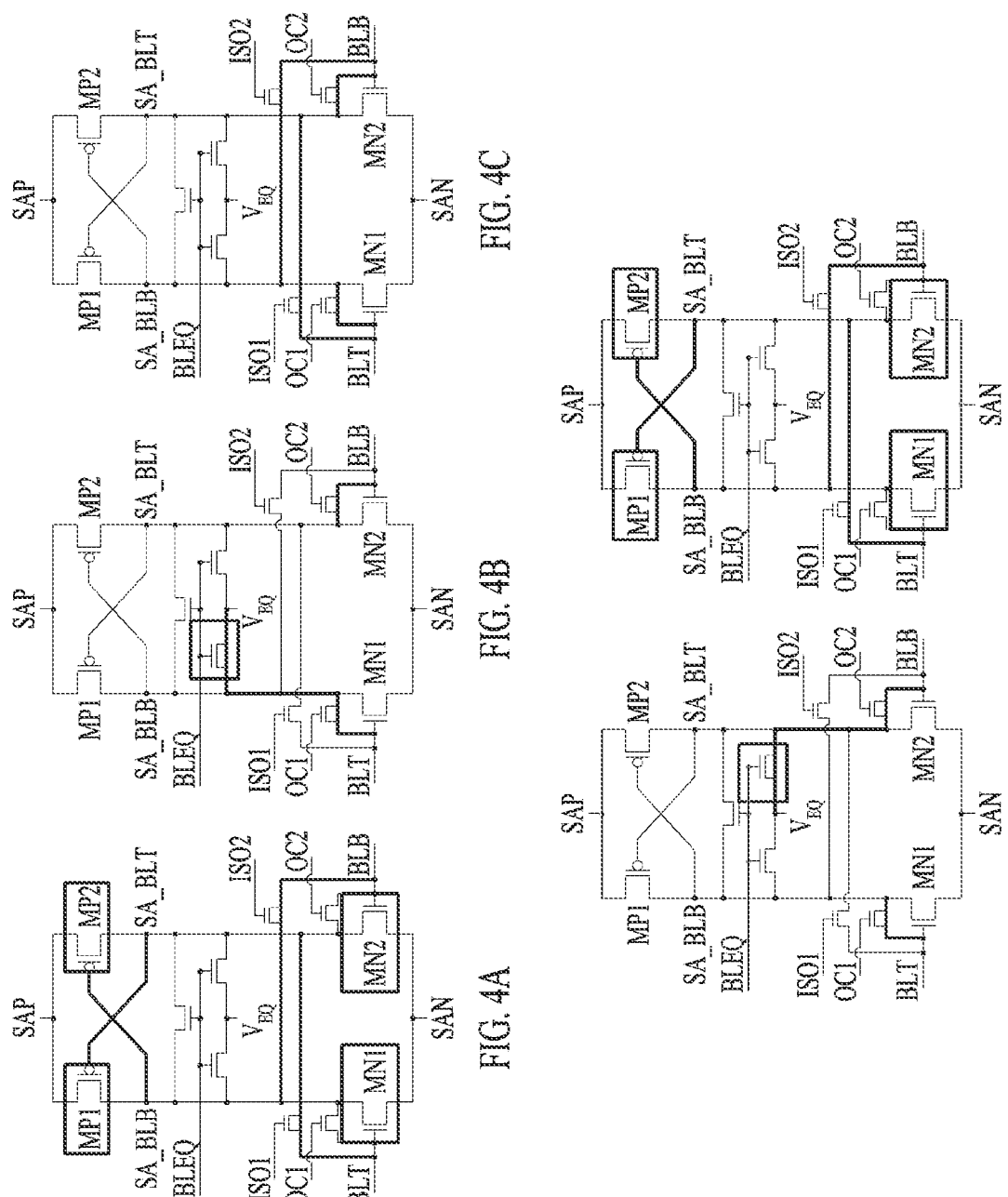
FIGS. 4A to 4E are diagrams illustrating a method of controlling a circuit for a NOT operation according to one or more embodiments of the disclosure.

FIG. 4A illustrates a structure of a memory device for a NOT operation according to one or more embodiments of the. The memory device may include a plurality of word-lines controllable in parallel, a bit line for simultaneously connecting at least one activated wordline among the word-lines, a bit line bar for transferring inversion data of the bit line, a sense amplifier for sensing data of the bit line and the bit line bar, and a pre-charge unit for pre-charging each of the voltage of the bit line and the voltage of the bit line bar.

In some cases, the sense amplifier detects cell data based on sensing and amplifying a difference between a bit line and a bit line bar. The bit line may have a voltage that depends on the state of the cell and the bit line bar may have a reference voltage.

In some examples the circuit may comprise an offset cancellation sense amplifier (OCSA). An OCSA is a specialized sense amplifier designed to detect and amplify small voltage differences between input lines, such as bit lines in a memory array, while mitigating the effects of input-referred offset voltages that may arise from device mis-matches, process variations, or other factors. In some cases, sense amplification methods other than OCSA may also be used.

In some embodiments, the operation of each transistor may be determined according to a control command from a memory controller, and inversion data of data of a cell may be sensed based operations resulting in the states illustrated through FIGS. 4A to 4E.

A structure using a sense amplifier, such as an offset cancellation sense amplifier (OCSA), may be used to implement a NOT operation according to one or more embodiments of the disclosure. The structure using the OCSA may include offset cancellation circuits 0C1 and 0C2 and isolation transistors IS01 and ISO2 for a first cell and a second cell, respectively. A $V_{EQ}$ transistor and a transistor for connecting SA_BLB to SA_BLT may also be included in the structure. In some cases, the structure includes a $V_{EQ}$ transistor and does not include a transistor for connecting SA_BLB to SA_BLT.

Sense amplifier bit line bar (SA_BLB) and sense amplifier bit line (SA_BLT) may be nodes in a sense amplifier (SA) circuit that are used for sensing and amplifying a difference between the data signals on the bit line and bit line bar. For example, in a NOT operation according to one or more embodiments of the disclosure, when the memory device includes a structure for pre-charging the bit line and the bit line bar, using the transistor for connecting SA_BLB to SA_BLT, the NOT operation may be performed by causing inversion data formed in the bit line bar to be transferred to the bit line.

FIG. 4A illustrates sensing data of the cell. In an embodiment, an isolation transistor ISO1 may operate, and MP1 and MP2 transistors may operate to activate a crossline, and MN1 and MN2 transistors may operate to sense the data of the cell through the bit line. For example, the data of the cell may be 0 and the voltage of the bit line bar may be 1.

In an embodiment, the memory device may initiate sensing of the data of the cell by activating the ISO1 transistor, followed by the activation of MP1 and MP2 transistors to activate a crossline. After that, MN1 and MN2 transistors may operate to sense the data of the cell through the bit line.

For example, when the data of the cell is programmed with a logic value of 0, the transistor inside the cell will have a high resistance state, resulting the voltage on the bit line connected to this cell to be low. In this example, the bit line bar will have a voltage that is higher compared to the voltage on the bit line after the pre-charging. In some examples, the difference in voltage between the bit line and the bit line bar corresponds to the data of the cell.

FIG. 4B illustrates pre-charging the voltage of the bit line. In order to pre-charge the voltage of the bit line, the OC1 transistor of the bit line and the OC2 transistor of the bit line bar may independently operate, and a transistor connected to the bit line may operate in BLEQ. In an embodiment, the bit line may be pre-charged, forming a reference voltage in the bit line. For example, the voltage on the bit line may be pre-charged to a lower level while the voltage on the bit line bar remains high. For example, the voltage of the bit line may correspond to ½ of the reference voltage and the voltage of the bit line bar may correspond to 1. In some cases, this reference voltage may then used in subsequent operations to compare with the voltage on the bit line and to perform logical operations such as a NOT operation on the data stored in the memory cell.

FIG. 4C illustrates sharing a voltage between the bit line and the bit line bar. In an embodiment, OC and ISO transistors in both the bit line and the bit line bar may operate. For example, the voltage of the bit line and the voltage of the bit line bar may be lowered or increased to the average voltage of the bit line and the average voltage of the bit line bar, respectively. According to one or more embodiments of the disclosure, a voltage of ¾ corresponding to an average of ½ and an average of 1 may be shared to each of the bit line and the bit line bar.

FIG. 4D illustrates pre-charging the voltage of the bit line bar. The OC1 transistor of the bit line and the OC2 transistor of the bit line bar may independently operate and the transistor connected to the bit line bar may operate in BLEQ. Under the assumption that the data of the cell is 0, inversion data may be obtained through the process of FIG. 4C, and a voltage between the bit line and the bit line bar may be inverted with respect to each other by pre-charging the voltage of the bit line bar corresponding to the opposite reference.

FIG. 4E illustrates sensing the inversion data of the cell as in a similar manner as in FIG. 4A. In an embodiment, to sense the inversion data, the MP1 and MP2 transistors may operate to activate a crossline, and the MN1 and MN2 transistors may operate to sense the inversion data. The cell's inversion data can then be sensed through the bit line and bit line bar. In one example, the voltage on the bit line corresponds to a value slightly higher than ¼ above the reference voltage of ½, allowing the output of a value of 1, while the voltage on the bit line bar corresponds to the reference voltage, allowing the output of a value of 0. In some embodiments, the NOT operation may be implemented in the same manner of an order even when the data of the cell corresponds to 1.

In some embodiments, the operations illustrated in FIGS. 4A to 4E enable a method of implementing the NOT operation without a DCC. When data pieces, such as D0, D1 . . . of FIG. 2, are generated in a subarray area by sensing of FIG. 4A, D0', D1' . . . , which corresponds to pieces of inversion data of the pieces of data in an area adjacent to the subarray, may be generated. The pieces of inversion data in the subarray area may be transferred through the embodiment as shown in FIG. 4 to implement the NOT operation in the memory device.

FIG. 5 is a flowchart illustrating an operating method of a memory controller according to one or more embodiments of the disclosure.

In an embodiment, an AND operation or an OR operation may be implemented in a memory device using three cells in a memory device. For example, in an AND or OR operation using three cells, two of the cells may act as inputs, while the remaining cell acts as a control input. The value input to one remaining cell is used to determine whether the operation should be an AND or an OR. The sensing of the voltage on the bit line is used to determine the result of the operation. In some cases, the AND or the OR operation may be implemented by sensing the voltage of a bit line connected to three activated wordlines through a sense amplifier.

When the AND operation or the OR operation is implemented by using data of the three cells, a sensing margin for the bit line may be approximately $\frac{1}{10}$ VDD. The activation of wordlines of the three cells may cause a situation in which a minimum sensing margin becomes less than a sensing margin.

In an embodiment, the AND operation or the OR operation may be implemented by performing a row copy on the data of the three cells and using data of six cells. It may be assumed that the three cells in the upper layer are A, B, and C, respectively. The AND or OR operation may be implemented by performing a row copy on data in A, B, and C, and utilizing the data of three additional cells in the lower layer, as described in embodiments of the disclosure. According to one or more embodiments of the disclosure, using data of six cells in two layers may address the issue where minimum sensing margin is less than the sensing margin of the bit line.

In operation 510, the memory controller may receive a command through a host interface.

In an embodiment, the memory controller may determine whether the AND operation or the OR operation is to be performed through the memory device. For example, the memory controller may examine the received command to determine whether it is an AND or an OR operation. Based on the type of operation requested, the memory controller then proceeds with the corresponding operation.

In operation 520, when the memory controller determines that the AND operation or the OR operation is to be performed based on the command, the memory controller may determine an input to a third cell to control the operation of the first and second cells.

For example, when the memory controller performs an AND operation between the first and second cells, the memory controller may set the input to the third cell to be 0 and sense voltages of the first cell to the third cell, which are activated in the bit line, to obtain a result of the AND operation with respect to inputs to the first cell and the second cell.

Alternatively, if the memory controller determines to perform the OR operation on the first and second cells, the memory controller may s the input to the third cell to be 1 and sense voltages of the first cell to the third cell, which are activated in the bit line, to obtain a result of the OR operation with respect to inputs to the first cell and the second cell.

In operation 530, the memory controller may sense the data of the first, second, and third cells, which are connect to three wordlines, respectively.

In an embodiment, the memory controller may sense the data of the third cell determined based on the data input to the first cell and the second cell and the type of operation to be performed. The sensing the data of the third call may be performed through the activation of the corresponding wordline and reading the bit line connected to the third cell.

In operation 540, the memory controller may activate the wordline of a fourth cell to the wordline of a sixth cell, which connect to the three wordlines below the first cell to the third cell, respectively, and identically copy the data of the first cell to the data of the third cell into the fourth cell to the sixth cell. For example, the six cells may have two layers, where the first, second, and third cell are disposed in the upper layer, and the fourth, fifth, and sixth cell are disposed in the lower layer.

In an embodiment, the data of the first, second, and third cell may be row-copied into the wordline of the fourth, fifth, and sixth cell.

In operation 550, the memory controller may sense the AND value or the OR value of the data of the first cell and the AND value or the OR value of the data of the second cell, based on a voltage formed in the bit line connected to the first cell to sixth cell.

As in the embodiment, a minimum sensing margin may be doubled by activating twice as many wordlines.

The sensing margin according to one or more embodiments of the disclosure may be represented by the following equation:

$$\delta = \frac{k \cdot C_c \cdot V_{DD} + C_b \cdot \frac{1}{2} V_{DD}}{3C_c + C_b} - \frac{1}{2} V_{DD}$$
$$= \frac{(2k-3)C_c}{6C_c + 2C_b} V_{DD}$$

where k denotes the number of cells with a value of '1' among Activated Cells, $V_{DD}$ may denotes a reference voltage, the first cell to the sixth cell are indicated as A to F, respectively, and where $C_b$ and $C_c$ denote the capacitance of B and the capacitance of C.

For example, activating 3n wordlines may result in VDD* (2k-3)*n*Cc/(6*n*Cc+2Cb), Cb=4Cc. Accordingly, the capacitance of the bit line may be calculated as four times the capacitance of the cell. In this case, the sensing margin calculated the lowest may be VDD*n/(6n+8). In an embodiment, because six wordlines are activated to correspond to n=2, an issue on the sensing margin may be addressed by using 2/20VDD=1/10VD.

When twice as many wordlines are activated, taking into account the capacitance ratio of the bit line and the cell, performing the AND or OR operation according to embodiments of the disclosure reduces likelihood of an error occurring due to a reduced sensing margin is reduced, compared to performing the AND or OR operation using only three wordlines According to some embodiments, performing such an operation may be implemented without any change in a circuit. In an embodiment, the number of wordlines to be activated may double but overhead may not occur during a normal operation even when more wordlines are activated in the embodiment since new wordlines are not physically allocated.

Figure 6:
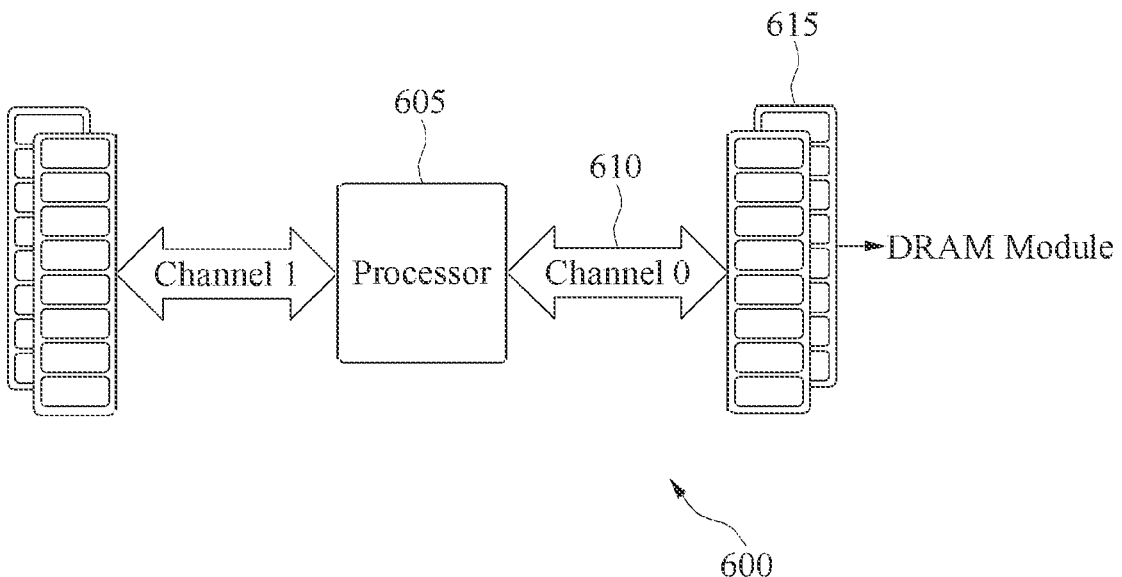
FIG. 6 illustrates an arrangement of a computing device according to one or more embodiments of the disclosure.

FIG. 6 illustrates an arrangement of a computing device 600 according to one or more embodiments of the disclosure. The computing device includes a processor 605, channels 610, and a memory module 615 (e.g., a DRAM module, although the disclosure is not limited thereto, and other memory modules could be used.).

A processor 605 may be an intelligent hardware device, (e.g., a general-purpose processing component, a digital signal processor (DSP), a central processing unit (CPU), a graphics processing unit (GPU), a microcontroller, an application specific integrated circuit (ASIC), a field programmable gate array (FPGA), a programmable logic device, a discrete gate or transistor logic component, a discrete hardware component, or any combination thereof). In some cases, the processor 605 is configured to operate a memory array using a memory controller. In other cases, a memory controller is integrated into the processor 605. In some cases, the processor 605 is configured to execute computer-readable instructions stored in a memory to perform various functions. In some embodiments, a processor includes special purpose components for modem processing, baseband processing, digital signal processing, or transmission processing.

The processor 605 may execute software. Software may include code to implement aspects of the disclosure. Software may be stored in a non-transitory computer-readable medium such as memory or other system memory. In some cases, the software may not be directly executable by the processor 605 but may cause a computer (e.g., when compiled and executed) to perform functions described herein.

The memory device may include a memory module 615 such as a dynamic random-access memory (DRAM) module. A DRAM module is a circuit board that contains dynamic random-access memory chips used to store and retrieve digital information. DRAM modules are commonly used in personal computers, laptops, and servers to provide volatile memory for temporary storage and retrieval of data. The modules typically come in standardized form factors, such as DIMM (dual in-line memory module) or SODIMM (small outline dual in-line memory module) and are designed to be easily replaceable or upgradable.

A channel 610 may be the communication pathway between different components in a computer system. In some examples, the channel 610 can be a physical connection between the processor and memory, such as a bus, or it can be a wireless connection, such as a wireless local area network (WLAN). The channel can also include other components such as controllers and switches to manage and direct the flow of data. In some examples, the channel's speed and bandwidth can significantly affect the overall performance of the computer system, as it determines how quickly the processor can access and transfer data from memory. In some examples, the channel may be optimized to improve the efficiency and speed of data transfer, such as through the use of cache memory or advanced communication protocols.

In an embodiment, the processor 605 is connected to two channels 610, e.g., channel 1 and channel 0. Each of channel 1 and channel 0 is connected to at least one memory module

615. In some examples, a memory module 615 connected to a channel 610 shares the buses of the channel 610. For example, the memory module 615 connected to channel 0 may comprise a plurality of memory devices or chips, and the plurality of memory devices or chips may share the buses of channel 0.

In some examples, channel 1 and channel 0 each have a set of command, address, and data buses, and a memory controller may control data transfer for one of the channel 1 and channel 0. In some cases, a memory controller may control the data transfer for both channel 1 and channel 0.

Although in FIG. 6, the processor is connected to two channels 610, the number of channels connected to the processor may not be limited thereto. For example, a processor may be connected to four or more channels 610.

Figure 7:
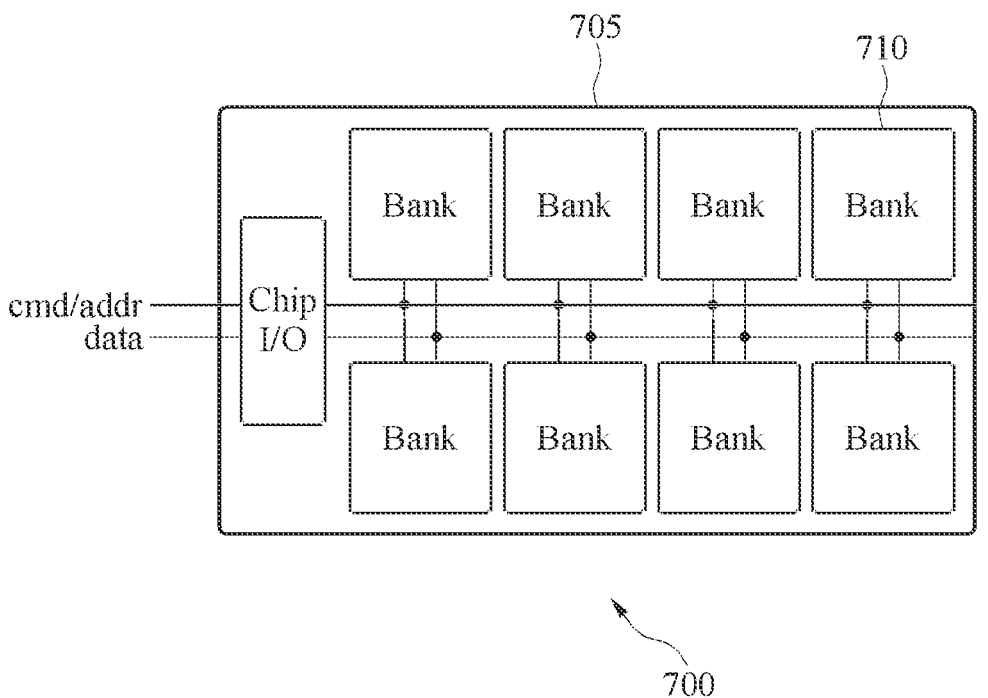
FIG. 7 illustrates a memory chip having a plurality of banks according to one or more embodiments of the disclosure.

FIG. 7 illustrates a memory chip 700 having a plurality of banks according to one or more embodiments of the disclosure. In some embodiments, the memory chip 700 is a DRAM chip. In an embodiment, a memory chip 700 comprises substrate 705 and a plurality of banks 710. A bank 710 refers to a portion of memory that can be accessed and managed independently of other portions, including other banks 710. For example, each bank 710 in the memory chip 700 may operate independently while sharing the same buses.

In some examples, the memory chip 700 includes a chip I/O. A chip I/O refers to the input/output interface of the memory chip 700 that manages the transfer of data to and from the chip's internal bus to the memory channel. The chip I/O may include multiplexing and demultiplexing logic that allows the chip to communicate with the memory controller and the memory channel.

In an embodiment, the plurality of banks 710 share internal command, address, and data buses. When a command/address data is sent to the memory chip 700, the data goes through the banks 710 via the shared internal buses. In some examples, each of the plurality of banks 710 operates independently, handling operations that involve the shared buses. In some examples, when a piece of data is accessed from a bank 710, it is first buffered at the chip I/O and sent out on the memory bus a number of bits (e.g., 8 bits) at a time.

Accordingly, the output width of each bank 710 may be 64 bits, and it may take several cycles to transfer 64 bits of data from a DRAM chip I/O logic onto the memory channel. In some examples, the banks 710 may store and retrieve data within the memory chip 700, and the chip I/O logic may manage the transfer of data to and from the internal buses and the memory channel.

Figure 8:
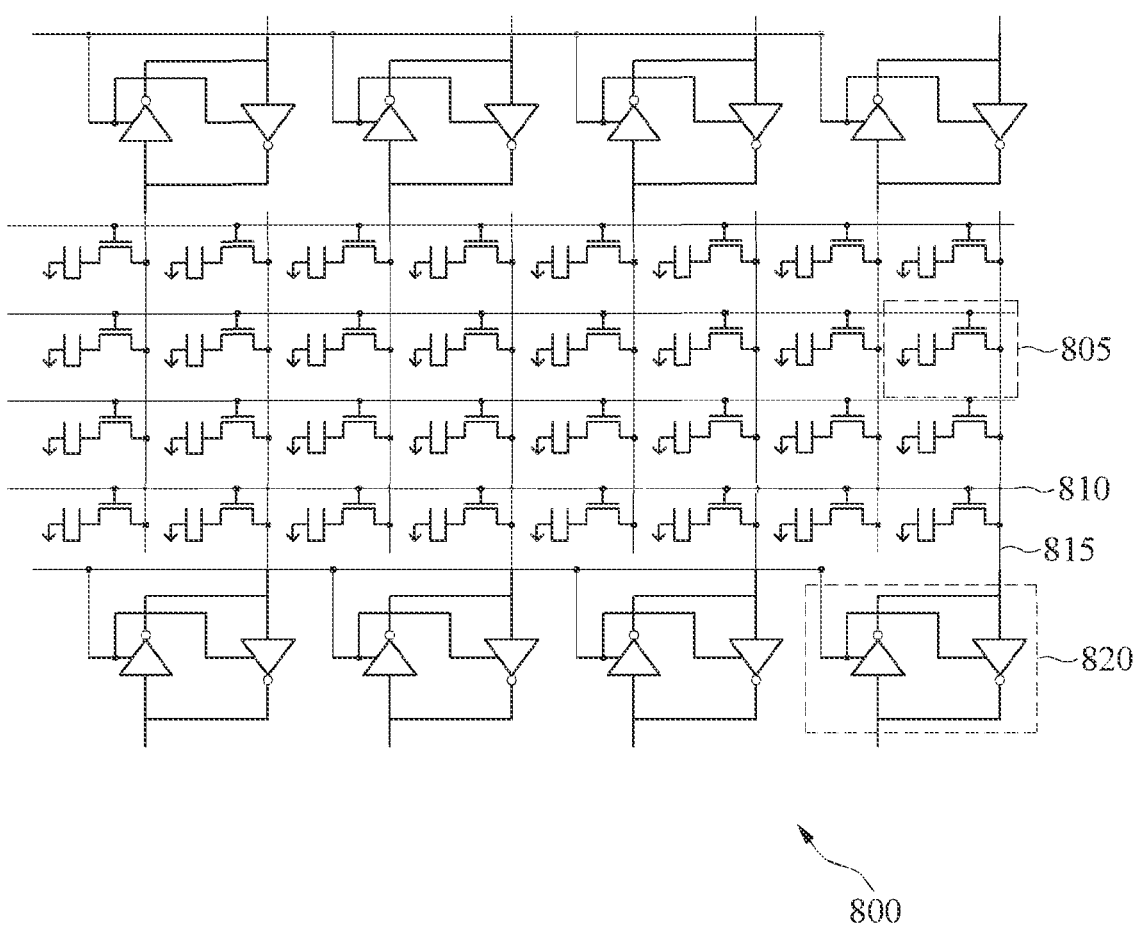
FIG. 8 illustrates an arrangement for organizing memory cells according to one or more embodiments of the disclosure.

FIG. 8 illustrates an arrangement 800 for organizing memory cells 805 (e.g., DRAM cells) according to one or more embodiments of the disclosure. In some cases, the arrangement 800 depicted in FIG. 8 may be referred to as an open bit line architecture. The arrangement 800 includes a column of wordlines 810, and a top row and a bottom row of sense amplifiers 820. In some cases, a sense amplifier 820 is wider than a memory cell 805, and the memory cells 805 may be arranged so that columns of memory cells 805 connected by a bit line 815 to a sense amplifier 820 on the top row alternate with columns of memory cells 805 connected by a bit line 815 to a sense amplifier 820 on the bottom row. In some cases, some sense amplifiers 820 are connected to memory cells 805 in columns both above and below the sense amplifier 820.

In an embodiment, a row of sense amplifiers 820 and a column of wordlines 810 may be shared by multiple memory cells 805. For example, each sense amplifier 820 in a row of sense amplifiers 820 may be shared by a column of cells 805. For example, each wordline 810 in a column of wordlines 810 may be shared by a row of cells 805.

Referring to FIG. 8, an array of cells 805 comprises multiple rows and columns of cells 805. In some examples, the array of cells 805 are connected to a top row of sense amplifiers 820 and a bottom row of sense amplifiers 820. For example, the cells 805 in a column are connected to both the top row of sense amplifiers 820 and the bottom row of sense amplifiers 820. In some examples, the cells 805 in a row share a wordline 810 of the column of wordlines 810. In some examples, half the cells 805 in the row are connected to the top row of sense amplifiers 820 and the remaining half of the cells 805 are connected to the bottom row of sense amplifiers 820.

Figure 9:
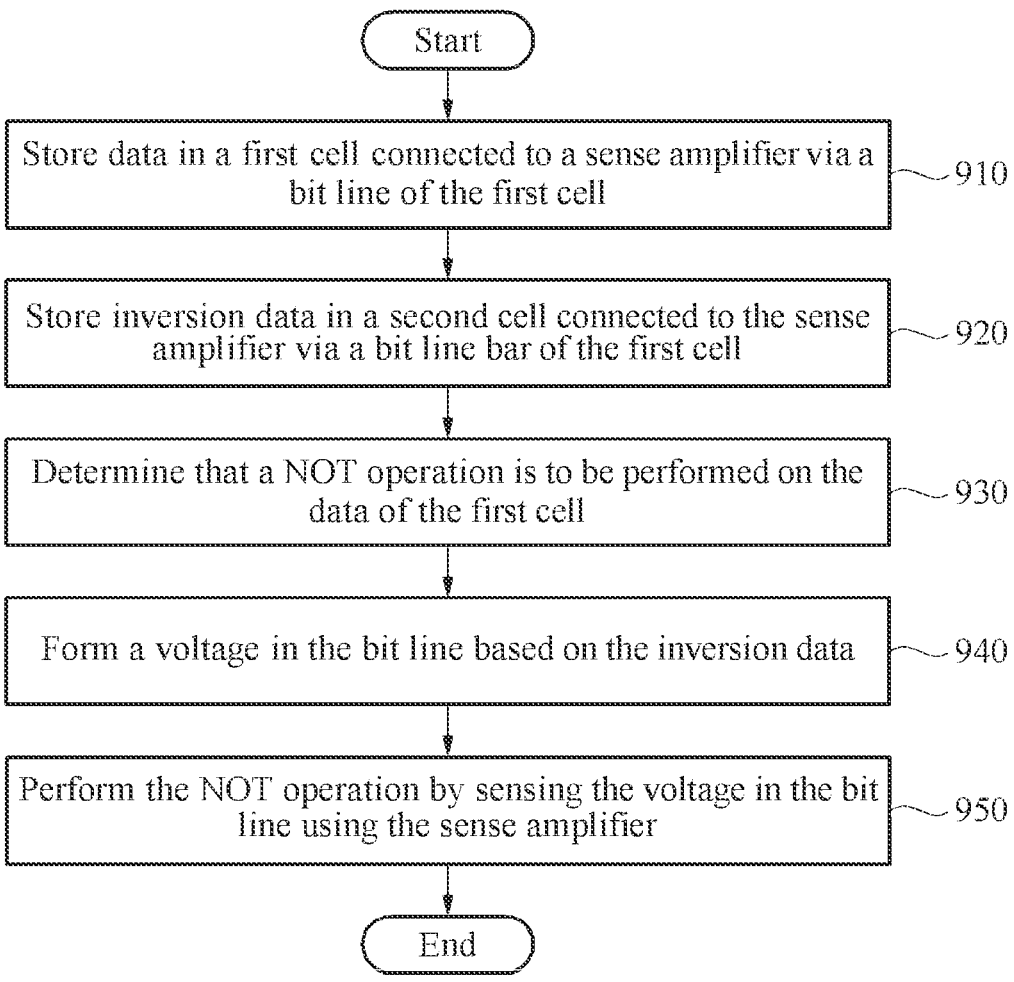
FIG. 9 is a flowchart illustrating a method of operating a memory device according to one or more embodiments of the disclosure.

FIG. 9 is a flowchart illustrating a method of operating a memory device according to one or more embodiments of the disclosure. The operations of FIG. 9 may be performed by a memory device operated by a memory controller as described herein.

In operation 910, the memory device stores data in a first cell connected to a sense amplifier via a bit line of the first cell.

In operation 920, the memory device stores inversion data in a second cell connected to the sense amplifier via a bit line bar of the first cell. For example, the inversion data may be related to the data according to a NOT relation.

In operation 930, the memory device determines that a NOT operation is to be performed on the data of the first cell. For example, the NOT operation could be part of a batch bulk bitwise operations to be performed withing the memory device (as opposed to within a processor of a host device).

In operation 940, the memory device forms a voltage in the bit line based on the inversion data. For example, the memory device may transfer a voltage from the bit line bar to the bit line, and then apply a reference voltage to the bit line bar.

In operation 950, the memory device performs the NOT operation by sensing the voltage in the bit line using the sense amplifier.

The methods according to the above-described embodiments may be recorded in non-transitory computer-readable media including program instructions to implement various operations of the above-described embodiments. The media may also include, alone or in combination with the program instructions, data files, data structures, and the like. The program instructions recorded on the media may be those specially designed and constructed for the purposes of embodiments, or they may be of the kind well-known and available to those having skill in the computer software arts.

Examples of non-transitory computer-readable media include magnetic media such as hard disks, floppy disks, and magnetic tape; optical media such as CD-ROM discs or DVDs; magneto-optical media such as optical discs; and hardware devices that are specially configured to store and perform program instructions, such as read-only memory (ROM), random access memory (RAM), flash memory, and the like. Examples of program instructions include both machine code, such as produced by a compiler, and files including higher-level code that may be executed by the computer using an interpreter. The above-described devices may be configured to act as one or more software modules in order to perform the operations of the above-described embodiments, or vice versa.

The software may include a computer program, a piece of code, an instruction, or some combination thereof, to independently or uniformly instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network-coupled computer systems so that the software is stored and executed in a distributed fashion. The software and data may be stored by one or more non-transitory computer-readable recording mediums.

While this disclosure includes specific embodiments, it will be apparent to one of ordinary skill in the art that various changes in form and details may be made in these embodiments without departing from the spirit and scope of the claims and their equivalents. The embodiments described herein are to be considered in a descriptive sense only, and not for purposes of limitation. Descriptions of features or aspects in each embodiment are to be considered as being applicable to similar features or aspects in other embodiments. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

What is claimed is:

1. An operating method of a memory controller of a memory device, the operating method comprising:
   determining that a NOT operation for data of a cell is to be performed by the memory device;
   forming, in a bit line connected to the cell, a reference voltage between a first voltage corresponding to the data and a second voltage corresponding to inversion data of the data;
   forming, in the bit line, a third voltage between the second voltage and the reference voltage by connecting the bit line and a bit line bar;
   forming the reference voltage in the bit line bar; and
   sensing the inversion data based on the third voltage formed in the bit line and the reference voltage formed in the bit line bar, wherein the inversion data comprises an output of the NOT operation for the data of the cell.

2. The operating method of claim 1, wherein sensing the data comprises forming the first voltage corresponding to the data in the bit line and forming the second voltage corresponding to an inversion voltage of the first voltage in the bit line bar.

3. The operating method of claim 1, wherein sensing of the inversion data comprises sensing the inversion data using a sense amplifier.

4. The operating method claim 1, wherein a first signal controlling a transistor for pre-charging the bit line is transmitted independently from a second signal for pre-charging the bit line bar.

5. The operating method of claim 1, wherein forming the reference voltage comprises pre-charging the bit line by reducing an initial voltage of the bit line to the reference voltage or increasing the initial voltage of the bit line to the reference voltage.

6. The operating method of claim 1, wherein connecting the bit line and the bit line bar comprises operating a transistor in a node connecting the bit line to the bit line bar.

7. The operating method of claim 1, wherein sensing the inversion data comprises is based on a difference between the reference voltage and the third voltage formed in the bit line.

8. A non-transitory computer-readable storage medium storing instructions that, when executed by a processor, cause the processor to perform the method of claim 1.

9. An operating method of a memory controller of a memory device, the operating method comprising:

determining that a logical operation is to be performed on a first cell and a second cell by the memory device, wherein the logical operation comprises an AND operation or an OR operation;

copying data of the first cell, the second cell, and a third cell into a fourth cell, a fifth cell, and a sixth cell, respectively; and sensing an output value of the logical operation based on a voltage formed in a bit line connected to the first cell and to the sixth cell.

10. The operating method of claim 9, further comprising:

setting a value of the third cell based on whether the logical operation comprises the AND operation or the OR operation.

11. The operating method of claim 9, further comprising:

simultaneously activating wordlines of the first cell to the sixth cell, respectively; and sensing, using a sense amplifier, a change in a voltage with respect to a bit line connected to the wordlines.

12. A memory device comprising:

a plurality of wordlines;

a bit line connected to at least one activated wordline among the plurality of wordlines;

a bit line bar configured to transfer inversion data of the bit line;

a sense amplifier configured to sense data of the bit line and data of the bit line bar; and a pre-charge unit configured to pre-charge the bit line and the bit line bar, wherein the pre-charge unit is configured to form a reference voltage between a first voltage corresponding to data of a cell and a second voltage corresponding to the inversion data of the data of the cell by pre-charging the bit line, wherein the memory device is configured to form, in the bit line, a third voltage between the second voltage and the reference voltage by connecting the bit line and the bit line bar, and wherein the memory device is configured to perform a NOT operation based on the inversion data.

13. The memory device of claim 12, wherein the memory device is configured to form the reference voltage in the bit line bar after forming the third voltage.

14. The memory device of claim 12, wherein the sense amplifier is configured to sense the inversion data of the data of the cell by amplifying a difference between the third voltage formed in the bit line and the reference voltage.

15. A method comprising:

storing data in a first cell connected to a sense amplifier via a bit line of the first cell;

storing inversion data in a second cell connected to the sense amplifier via a bit line bar of the first cell;

determining that a NOT operation is to be performed on the data of the first cell;

forming a voltage in the bit line based on the inversion data; and performing the NOT operation by sensing the voltage in the bit line using the sense amplifier.

16. The method of claim 15, further comprising:

forming a reference voltage in the bit line;

connecting the bit line and the bit line bar to form the voltage in the bit line; and forming the reference voltage in the bit line bar; and detecting a voltage difference between the bit line and the bit line bar, wherein the NOT operation is performed based on the voltage difference.

17. The method of claim 15, wherein the first cell and the second cell comprise dynamic random access memory (DRAM) memory cells.

18. The method of claim 15, wherein the first cell and the second cell are arranged according to an open bit line architecture, and wherein the first cell is located in a different subarray than the second cell.

* * * * *